(12) United States Patent
Logan et al.

(10) Patent No.: US 7,468,556 B2
(45) Date of Patent: Dec. 23, 2008

(54) PACKAGING OF HYBRID INTEGRATED CIRCUITS

(75) Inventors: Elizabeth A. Logan, Danville, CA (US); Curtis A. Ray, Alamo, CA (US)

(73) Assignee: LV Sensors, Inc., Emeryville, CA (US)

( * ) Notice: Subject to any disclaimer, the term of this patent is extended or adjusted under 35 U.S.C. 154(b) by 0 days.

(21) Appl. No.: 11/820,237

(22) Filed: Jun. 18, 2007

(65) Prior Publication Data

US 2008/0006939 A1    Jan. 10, 2008

Related U.S. Application Data

(60) Provisional application No. 60/815,216, filed on Jun. 19, 2006.

(51) Int. Cl.
*H01L 23/48* (2006.01)

(52) U.S. Cl. .................. 257/723; 257/777; 438/107; 438/108

(58) Field of Classification Search .................. 257/723, 257/777; 438/107, 108, 109, 110, 112
See application file for complete search history.

(56) References Cited

U.S. PATENT DOCUMENTS

| | | | |
|---|---|---|---|
| 4,838,089 A * | 6/1989 | Okada et al. ................ 73/727 |
| 5,291,061 A | 3/1994 | Ball | |
| 5,897,338 A | 4/1999 | Kaldenberg | |
| 6,140,144 A | 10/2000 | Najafi et al. | |
| 6,401,545 B1 | 6/2002 | Monk et al. | |
| 6,522,015 B1 | 2/2003 | Glenn et al. | |
| 6,732,588 B1 | 5/2004 | Mullenborn et al. | |
| 6,891,239 B2 | 5/2005 | Anderson et al. | |
| 6,918,297 B2 | 7/2005 | MacGugan | |
| 6,927,482 B1 | 8/2005 | Kim et al. | |
| 7,239,022 B2 * | 7/2007 | Ikezawa et al. ............. 257/777 |
| 7,365,427 B2 * | 4/2008 | Lu et al. .................... 257/723 |
| 2004/0188699 A1 | 9/2004 | Kameyama et al. | |

* cited by examiner

*Primary Examiner*—Roy K Potter
(74) *Attorney, Agent, or Firm*—Lumen Patent Firm

(57) ABSTRACT

Improved sensor packaging is provided with a hybrid integration approach. In one example, an application specific integrated circuit (ASIC) for sensor signal conditioning is packaged. The ASIC package has an aperture in it that exposes a chip to chip bonding interface of the ASIC chip. The rest of the ASIC chip is surrounded by the package, including the connections between the external package leads and the ASIC chip. A sensor chip, also having a chip to chip bonding interface, is disposed in the package aperture and bonded to the ASIC chip such that the two chip to chip bonding interfaces are connected. Flip chip bonding of the sensor chip to the ASIC chip is a preferred approach for chip to chip bonding. The vertical gap between the two chips can be filled in by an underfill process. The lateral gap between the sensor chip and the package can also be filled.

15 Claims, 4 Drawing Sheets

PACKAGING OF HYBRID INTEGRATED CIRCUITS

CROSS REFERENCE TO RELATED APPLICATIONS

This application claims the benefit of U.S. provisional patent application 60/815,216, filed on Jun. 19, 2006, entitled "Methods of Managing Parasitic Capacitance in Electronic Packages", and hereby incorporated by reference in its entirety.

FIELD OF THE INVENTION

This invention relates to packaging of electronic circuits.

BACKGROUND

Packaging of microelectronic sensors, such as MEMS sensors, presents several problems that do not usually arise in connection with standard electronic circuit packaging. For instance, monolithic integration of sensor with sensor electronics tends to incur costly redesign of the overall circuit as design rules for the electronics evolve. Accordingly, hybrid integration approaches are often considered for sensor packaging. For example, separate electronics and sensor chips can be placed in a pre-molded package, wire bonded to each other and to the package, and overfilled with a gel. A lid having an aperture can be used to close the package, where the aperture in the lid provides environmental access to the sensor. Such an assembly has the advantage of placing the electronics and the sensor in close proximity to one another. Such an arrangement can be of particular importance in the field of capacitive sensors, where the electrical properties of the interconnections can introduce significant errors into the sensor readings. However, the overfilling gel is also exposed to the environment. Thus contaminants (e.g., water) can be absorbed by the gel and eventually reach the electronics chip, thereby causing corrosion of the chip traces. This problem could be alleviated by molding the package directly to the hybrid assembly, thereby reducing the gel volume or even eliminating it entirely. However, such molding processes tend to impose excessive mechanical stress on the sensor chip, and are thus often inapplicable (e.g., for mechanical sensors such as pressure sensors).

In view of such difficulties, several other sensor packaging approaches have been considered in the art. For example, in U.S. Pat. No. 6,140,144, a sensor unit is flip chip bonded to a substrate having a through hole, thereby providing access from the environment to the active area of the sensor while sealing off the rest of the sensor unit from the environment. In U.S. Pat. No. 6,891,239, a sensor is bonded to one side of a substrate and an electronics chip is bonded to the other side of the substrate. Electrical connections between the sensor and the electronics chip are made through the substrate. In U.S. Pat. No. 6,732,588, a sensor is formed by vertically bonding two chips together. In U.S. Pat. No. 6,927,482 a premolded package completely surrounds the electronics chip, while leaving a premolded cavity for the sensor chip, which is connected to the electronics chip via the leadframe. This approach protects and isolates the electronics chip from the sensor chip but also entails long connections between the sensor chip and the electronics chip. A similar approach, in which the electronics chip is covered by a filler, is shown in U.S. Pat. No. 4,838,089.

However, these approaches do not provide a complete answer to the above-identified sensor packaging problems.

Accordingly, there is a need in the art for sensor packaging providing an improved combination of 1) low mechanical stress on the sensor; 2) access from the environment to the sensor active region; 3) isolation of all parts of the sensor other than the sensor active region from the environment; and 4) minimal interconnection length between the sensor and sensor electronics to reduce parasitics.

SUMMARY

Improved sensor packaging is provided with a hybrid integration approach. In one example, an application specific integrated circuit (ASIC) for sensor signal conditioning is packaged. The ASIC package has an aperture in it that exposes a chip to chip bonding interface of the ASIC chip. The rest of the ASIC chip is surrounded by the package, including the connections between the external package leads and the ASIC chip. A sensor chip, also having a chip to chip bonding interface, is disposed in the package aperture and bonded to the ASIC chip such that the two chip to chip bonding interfaces are connected. Flip chip bonding of the sensor chip to the ASIC chip is a preferred approach for chip to chip bonding. The vertical gap between the two chips can be filled in by an underfill process. The lateral gap between the sensor chip and the package can also be filled.

This packaging approach provides several significant advantages. Package-induced stress on the sensor chip can be reduced to a negligible level, since there is no direct mechanical contact between the package and the sensor chip. Accordingly, embodiments of the invention are particularly suitable for packaging mechanically sensitive sensors, such as pressure sensors. Isolation of the ASIC chip from the environment is provided, and can be further improved. More specifically, the package can be molded to cover all of the ASIC chip except the bonding interface, thereby providing a high degree of protection for the covered parts of the ASIC chip. Filling the vertical and lateral gaps with appropriate underfill and lateral fill materials also improves isolation of the ASIC chip from the environment. A metal ring can be fabricated on the surface of the ASIC chip, extending from under the sensor chip to under the package, thereby providing further protection from moisture. In addition, positioning the sensor chip directly on top of its associated electronics chip provides the advantages of minimal interconnect length and reduced interconnect inductance and parasitics, usually only associated with monolithically integrated circuits. Finally, the sensor chip has ready access to the environment. Accordingly, embodiments of the invention can provide the above-identified combination of sensor environmental access, low mechanical stress on the sensor chip, environmental isolation of the electronics and minimal interconnection parasitics.

A further advantage provided by the invention is separate modularization of the sensor and sensor electronics. In particular, once an interface between sensor and sensor electronics is defined, design and improvement of the sensor and of the sensor electronics can proceed independently, as long as the interface standard is not changed.

DETAILED DESCRIPTION

Figure 1A:
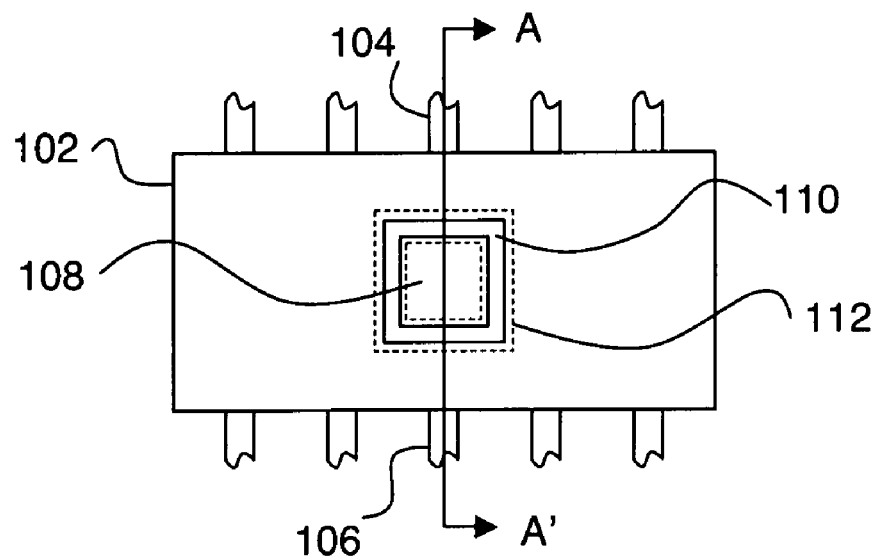
FIGS. 1a-b shows two views of a packaged sensor assembly according to an embodiment of the invention.
Figure 1B:
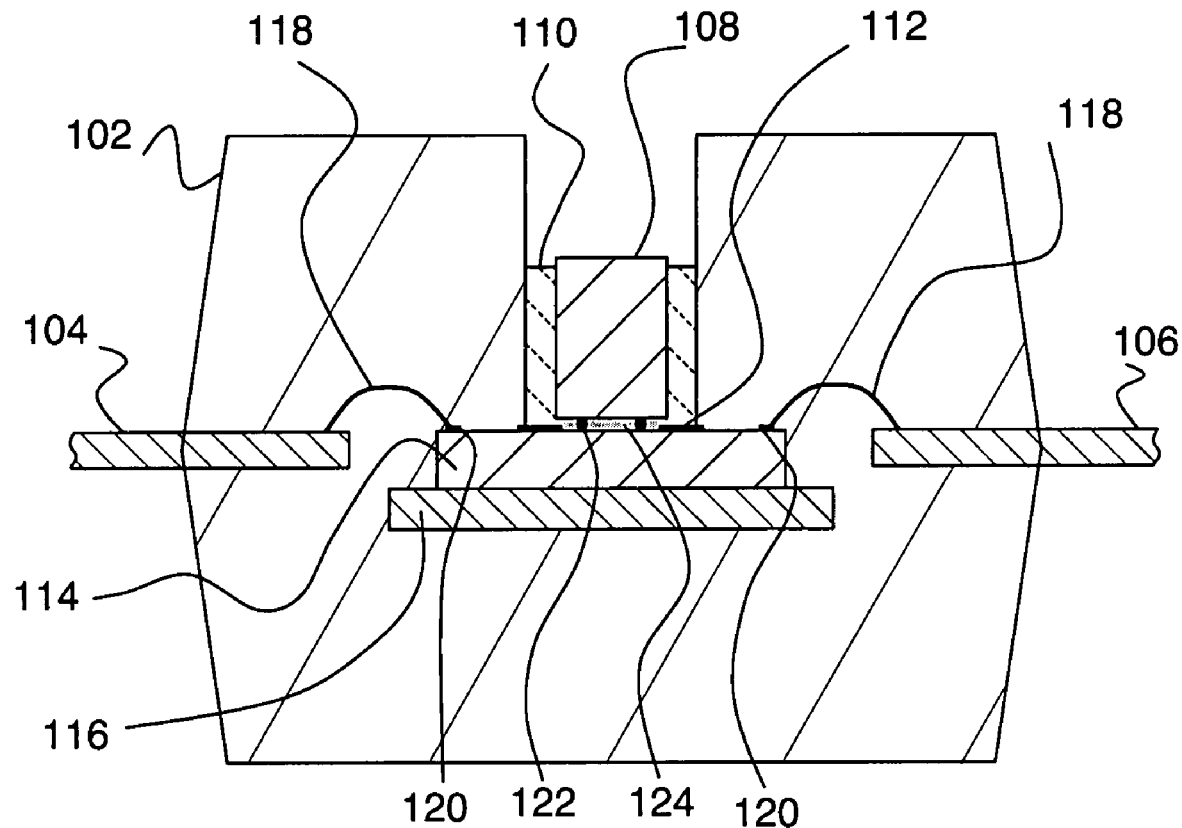

FIGS. 1a-b shows two views of a packaged sensor assembly according to an embodiment of the invention. FIG. 1a shows a top view, and FIG. 1b shows a cross section view along line AA' of FIG. 1a. In this example, a first IC chip 114 (e.g., a sensor signal conditioning ASIC chip) is flip chip bonded to a second IC chip 108 via one or more vertical bonds, one of which is labeled as 122. First IC chip 114 is connected to external package leads, e.g., leads 104 and 106, via wire bonds 118 connecting contact pads 120 to leads 104 and 106. A package 102 surrounds all connections of the first IC chip to the external package leads. Package 102 leaves part of first IC chip 114 exposed, and the exposed part of first chip 114 includes a first chip to chip bonding interface. First IC chip 114 is disposed on a die paddle 116, which is part of the lead frame also including leads 104 and 106.

A second IC chip 108 (e.g., a MEMS sensor chip) is disposed in the aperture of package 102 such that chip to chip contact is made between first IC chip 114 and second IC chip 108. In this example, the bottom surface of second IC chip 108 includes a second chip to chip bonding interface, and the first and second chip to chip bonding interfaces are connected to each other (e.g., by being mated in a flip chip bonding process). Second IC chip 108 is designed such that it receives all of its necessary connections via the above-described chip to chip connections, without requiring any other electrical connections.

The example of FIGS. 1a-b also shows several optional features for improving environmental isolation of first IC chip 114. These optional features include guard ring 112, underfill 124, and lateral fill 110. Guard ring 112 is preferably a metal ring disposed on the top surface of first IC chip 114 extending at least from beneath edges of second IC chip 108 to beneath package 102, as shown. More specifically, in this example guard ring 112 has the general shape of a square ring, as shown by the dotted lines on FIG. 1a. The flip chip bonds in this example are enclosed by and electrically isolated from guard ring 112. Guard ring 112 is disposed to cover the part of first IC chip 114 that is exposed by the lateral gap between second IC chip 108 and package 102. Providing such additional protection to this part of first IC chip 114 is preferred to reduce the likelihood of environmental contamination of first IC chip 114 by exposure through the lateral gap. Although the ASIC chip would ordinarily have oxide or nitride covering that part of its surface, additional protection can be provided by the metal guard ring.

Providing an underfill 124 is preferred to improve flip chip bond reliability. Suitable materials and methods for providing such underfill are well known in the art. Typically, underfill 124 is induced to move into position by a wicking process, although other methods, such as applying the underfill material to the face of one of the chips before bonding, are also suitable for practicing the invention. Providing a lateral fill 110 is preferred to reduce the chance of contamination of chip 114 through the lateral gap. Suitable materials for such a lateral fill include, but are not limited to, epoxy glob top materials, gels, and elastomers (e.g., silicones or fluorosilicones).

A key aspect of embodiments of the invention is lack of package-induced stress on second IC chip 108. This is an especially critical factor in cases where second IC chip 108 is a mechanically sensitive sensor, such as a pressure sensor.

Figure 2A:
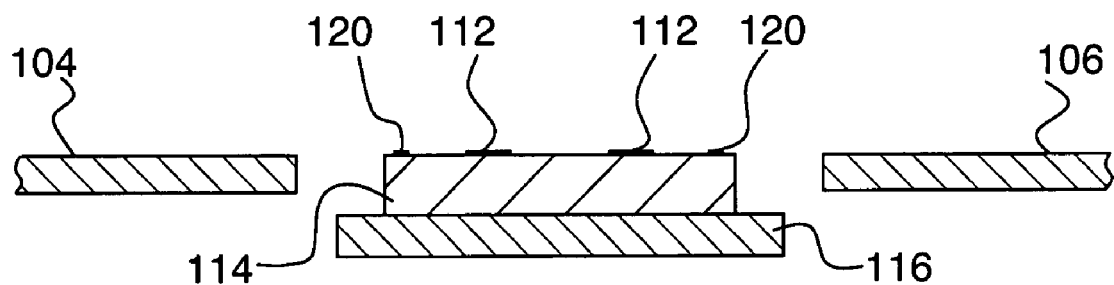
FIGS. 2a-e show an exemplary fabrication sequence for fabricating an embodiment of the invention.
Figure 2B:
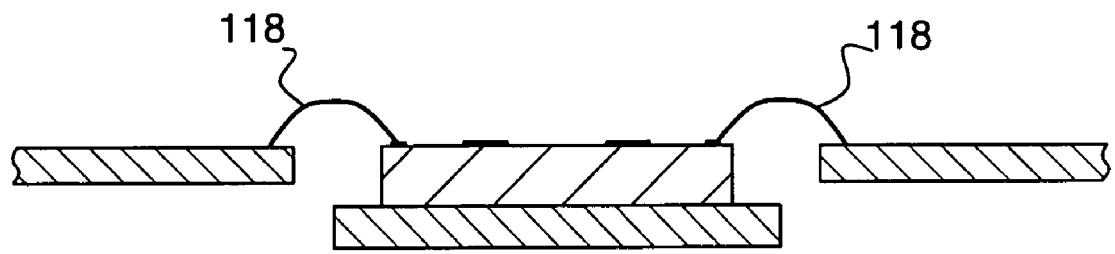

FIGS. 2a-e show an exemplary fabrication sequence for fabricating an embodiment of the invention. FIG. 2a shows an initial configuration where first IC chip 114 is disposed on a die paddle 116 of a lead frame also including leads 104 and 106. The top surface of first IC chip 114 also includes contact pads 120 and guard ring 112. Such structures can be fabricated by conventional IC fabrication methods. FIG. 2b shows the result of wire bonding first IC chip 114 to leads 104 and 106 with wire bonds 118.

Figure 2C:
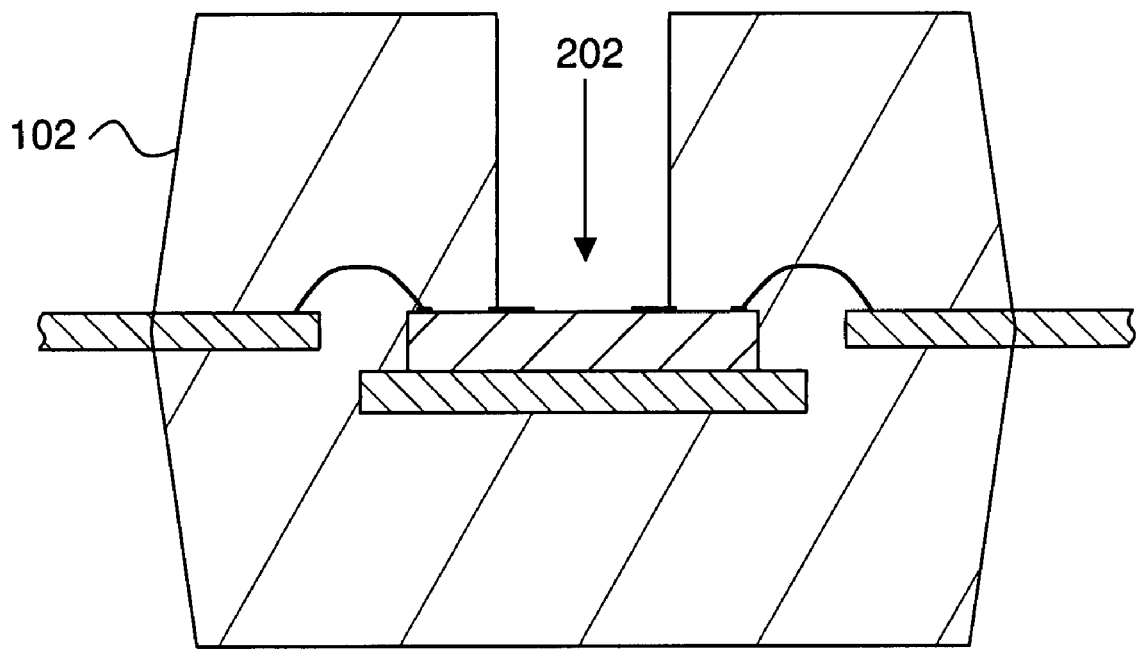

FIG. 2c shows the result of molding a package 102 around the configuration of FIG. 2b such that a first chip to chip bonding interface 202 on first IC chip 114 is exposed, with the rest of chip 114 being surrounded by package 102. In this example, first bonding interface 202 includes features (not shown) for flip chip bonding, such as solder wettable pads to receive solder bumps located on the sensor chip. Suitable methods for providing flip chip bonding interfaces, including but not limited to sputtering or plating of an underbump metallization and wettable metal layer, adhesive interconnects, anisotropic adhesive interconnects and gold stud bumping are well known in the art. Processing of IC chip 114 can include fabrication of redistribution and/or interconnect layers to locate sensor contacts in contact interface 202.

Suitable methods for molding a package having an aperture as shown on FIG. 2c are known in the art, and are thus not described here. For example, U.S. Pat. No. 5,897,338 considers such a transfer molding process. Packaging having an aperture has been considered in connection with providing a transparent window in the package. Such packages can provide optical access to a packaged optoelectronic device. In contrast, embodiments of the present invention relates to hybrid integration of an aperture-packaged device with a chip disposed in the aperture.

Figure 2D:
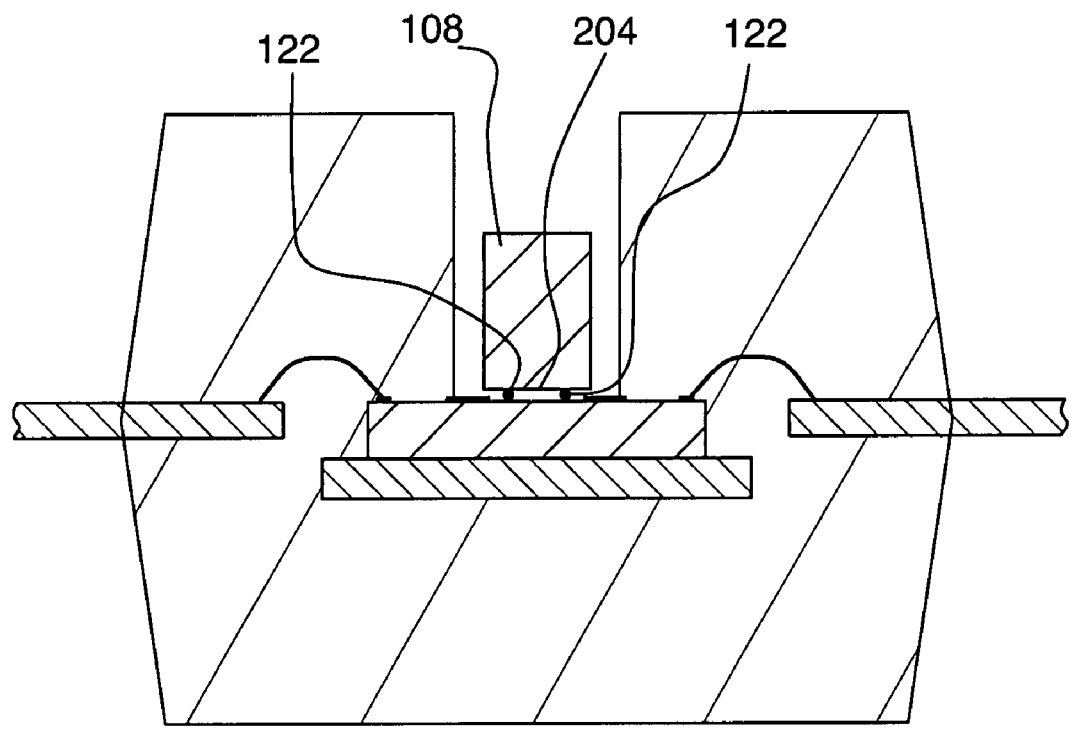

FIG. 2d shows the result of disposing second IC chip 108 in the aperture of package 102, and flip chip bonding second chip 108 to first chip 114. Second IC chip 108 includes a second chip to chip bonding interface 204, which in this example includes solder bumps 122. A noteworthy feature of this fabrication sequence is that second IC chip 108 is added after package 102 is formed. Thus there is no need for second IC chip 108, which may be a mechanically sensitive sensor, to be subjected to the package molding process.

Figure 2E:
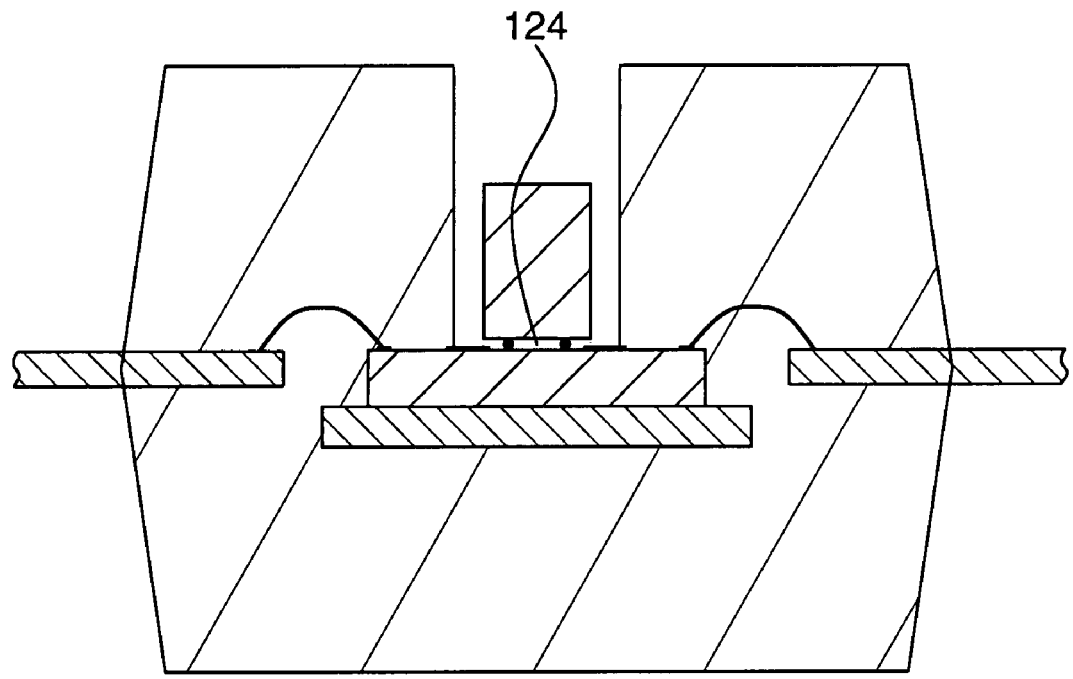

FIG. 2e shows the result of providing an underfill 124 to fill the vertical gap between first chip 114 and second chip 108. Adding a lateral fill 110 to the structure of FIG. 2e gives the structure of FIG. 1b, as described above.

Figure 3:
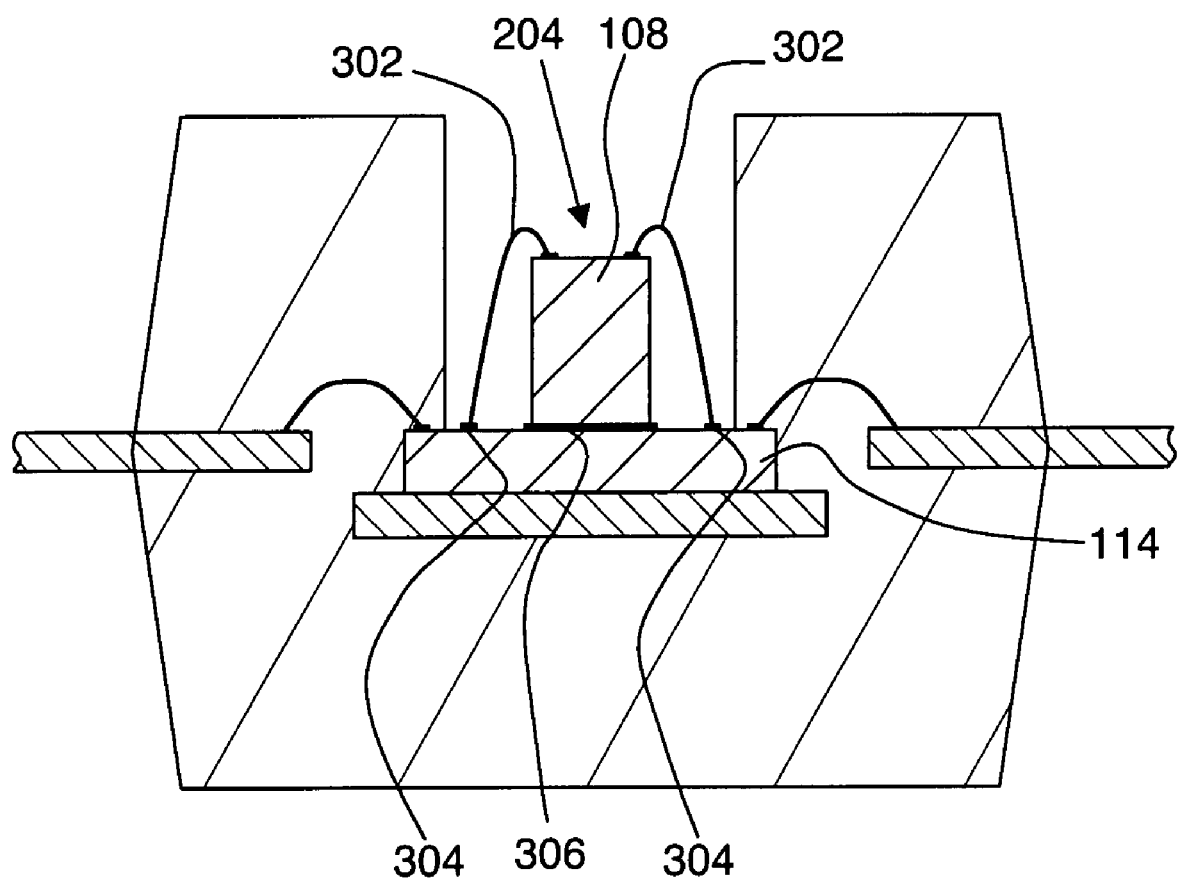
FIG. 3 shows an alternate embodiment of the invention.

The preceding description has been by way of example, as opposed to limitation, and the invention can also be practiced according to many variations of the given embodiments. For example, FIG. 3 shows an alternate embodiment of the invention where wire bonding is used to provide the chip to chip connections. In this example first IC chip 114 includes chip to chip contact pads 304. Second IC chip 108 includes a second chip to chip bonding interface 204 on its top surface. Wire bonds 302 extend from bonding interface 204 to contact pads 304. Second chip 108 is attached to first chip 114 at a mechanical bond 306.

Although the preferred method of connecting first IC chip 114 to the package is by the use of wire bonds to a leadframe-based package, as described above, it will be apparent that other methods of forming electrical connections between the first IC chip and the package, such as flip chip bonding, could also be applied in this invention and that the invention could be applied to any format of molded package. It is clear that the package could also be used for a variety of different configurations, for example a single electronics chip with multiple apertures for multiple sensor die, or a more complex system in package, in which multiple die are molded with one or more apertures above one or more die.

Practice of the invention is broadly compatible with standard microelectronics fabrication and packaging materials and methods, including MEMS technology and flip chip technology. Bonding of sensors to packaged circuits can be performed on individual packaged circuits, or can be included at earlier stages of the packaging process where multiple packaged devices are processed together in strip form.

The invention claimed is:

1. A hybrid integrated circuit assembly comprising:
    a first integrated circuit (IC) chip having a first chip to chip bonding (CCB) interface;
    a package having external electrical leads electrically connected to said first IC chip, wherein said package surrounds all connections of said electrical leads to said first IC chip and does not cover said first CCB interface, thereby defining a package aperture;
    a second IC chip disposed in said package aperture and having a second CCB interface, wherein said first CCB interface and said second CCB interface are connected.

2. The assembly of claim 1, wherein said second IC chip comprises a microelectromechanical (MEMS) sensor, and wherein said first IC chip comprises sensor signal conditioning circuitry.

3. The assembly of claim 2, wherein said MEMS sensor comprises a pressure sensor.

4. The assembly of claim 1, wherein said first and second CCB interfaces are selected from the group consisting of: flip chip bonding interface, adhesive bonding interface, anisotropic adhesive bonding interface, gold stud bumping interface, and wire bonding interface.

5. The assembly of claim 1, further comprising a protective metal layer disposed on a top surface of said first IC chip, wherein said protective metal layer extends at least from beneath edges of said second IC chip to beneath said package.

6. The assembly of claim 1, wherein said package provides substantially no mechanical stress to said second IC chip.

7. A method of fabricating a hybrid integrated circuit assembly, the method comprising:
    providing a first integrated circuit (IC) chip having a first chip to chip bonding (CCB) interface;
    packaging said first IC chip in a package having external electrical leads connected to said first IC chip such that said package surrounds all connections of said electrical leads to said first IC chip and does not cover said first CCB interface, thereby defining a package aperture;
    disposing a second IC chip having a second CCB interface in said package aperture such that said first CCB interface and said second CCB interface are connected.

8. The method of claim 7, wherein said disposing a second IC chip is performed after said packaging said first IC chip.

9. The method of claim 7, further comprising filling a lateral gap between said second IC chip and said package.

10. The method of claim 9, wherein said filling a lateral gap comprises filling said lateral gap with a material selected from the group consisting of epoxy glob top materials, gels, and elastomers.

11. The method of claim 7, further comprising filling a vertical gap between said first IC chip and said second IC chip.

12. The method of claim 11, wherein said filling a vertical gap comprises wicking an underfill material into said vertical gap.

13. The method of claim 7, wherein said first and second CCB interfaces are selected from the group consisting of: flip chip bonding interface, gold stud bumping interface, adhesive bonding interface, anisotropic adhesive bonding interface, and wire bonding interface.

14. The method of claim 7, further comprising depositing a protective metal layer on a top surface of said first IC chip, wherein said protective metal layer extends at least from beneath edges of said second IC chip to beneath said package.

15. The method of claim 7, wherein said package provides substantially no mechanical stress to said second IC chip.

* * * * *